(12) United States Patent
Wang et al.

(10) Patent No.: US 11,005,030 B2
(45) Date of Patent: May 11, 2021

(54) MAGNETORESISTIVE RANDOM ACCESS MEMORY

(71) Applicant: UNITED MICROELECTRONICS CORP., Hsin-Chu (TW)

(72) Inventors: Hui-Lin Wang, Taipei (TW); Ying-Cheng Liu, Tainan (TW); Yi-An Shih, Changhua County (TW); Yi-Hui Lee, Taipei (TW); Chen-Yi Weng, New Taipei (TW); Chin-Yang Hsieh, Tainan (TW); I-Ming Tseng, Kaohsiung (TW); Jing-Yin Jhang, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 129 days.

(21) Appl. No.: 16/297,704

(22) Filed: Mar. 10, 2019

(65) Prior Publication Data

US 2020/0266335 A1    Aug. 20, 2020

(30) Foreign Application Priority Data

Feb. 14, 2019    (CN) .......................... 201910114096.7

(51) Int. Cl.
*H01L 43/02*    (2006.01)
*H01L 27/22*    (2006.01)
*H01L 43/10*    (2006.01)
*H01L 43/12*    (2006.01)

(52) U.S. Cl.
CPC ............ *H01L 43/02* (2013.01); *H01L 27/228* (2013.01); *H01L 43/10* (2013.01); *H01L 43/12* (2013.01)

(58) Field of Classification Search
None
See application file for complete search history.

(56) References Cited

U.S. PATENT DOCUMENTS

| 2011/0089511 A1* | 4/2011 | Keshtbod | ............... B82Y 10/00 257/422 |
| 2017/0084822 A1* | 3/2017 | Kim | ..................... H01L 43/08 |
| 2020/0035908 A1* | 1/2020 | Ku | ..................... H01L 27/228 |

* cited by examiner

*Primary Examiner* — Nicholas J Tobergte
*Assistant Examiner* — Kien C Ly
(74) *Attorney, Agent, or Firm* — Winston Hsu

(57) ABSTRACT

A semiconductor device preferably includes a metal-oxide semiconductor (MOS) transistor disposed on a substrate, an interlayer dielectric (ILD) layer disposed on the MOS transistor, and a magnetic tunneling junction (MTJ) disposed on the ILD layer. Preferably, a top surface of the MTJ includes a reverse V-shape while the top surface of the MTJ is also electrically connected to a source/drain region of the MOS transistor.

9 Claims, 8 Drawing Sheets

MAGNETORESISTIVE RANDOM ACCESS MEMORY

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device preferably includes a metal-oxide semiconductor (MOS) transistor disposed on a substrate, an interlayer dielectric (ILD) layer disposed on the MOS transistor, and a magnetic tunneling junction (MTJ) disposed on the ILD layer. Preferably, a top surface of the MTJ includes a reverse V-shape while the top surface of the MTJ is also electrically connected to a source/drain region of the MOS transistor.

According to another aspect of the present invention, a semiconductor device includes a magnetic tunneling junction (MTJ) on a substrate, a first spacer on a first sidewall of the MTJ, and a second spacer on a second sidewall of the MTJ, wherein the first spacer and the second spacer are asymmetric. Preferably, a top surface of the MTJ comprises a reverse V-shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
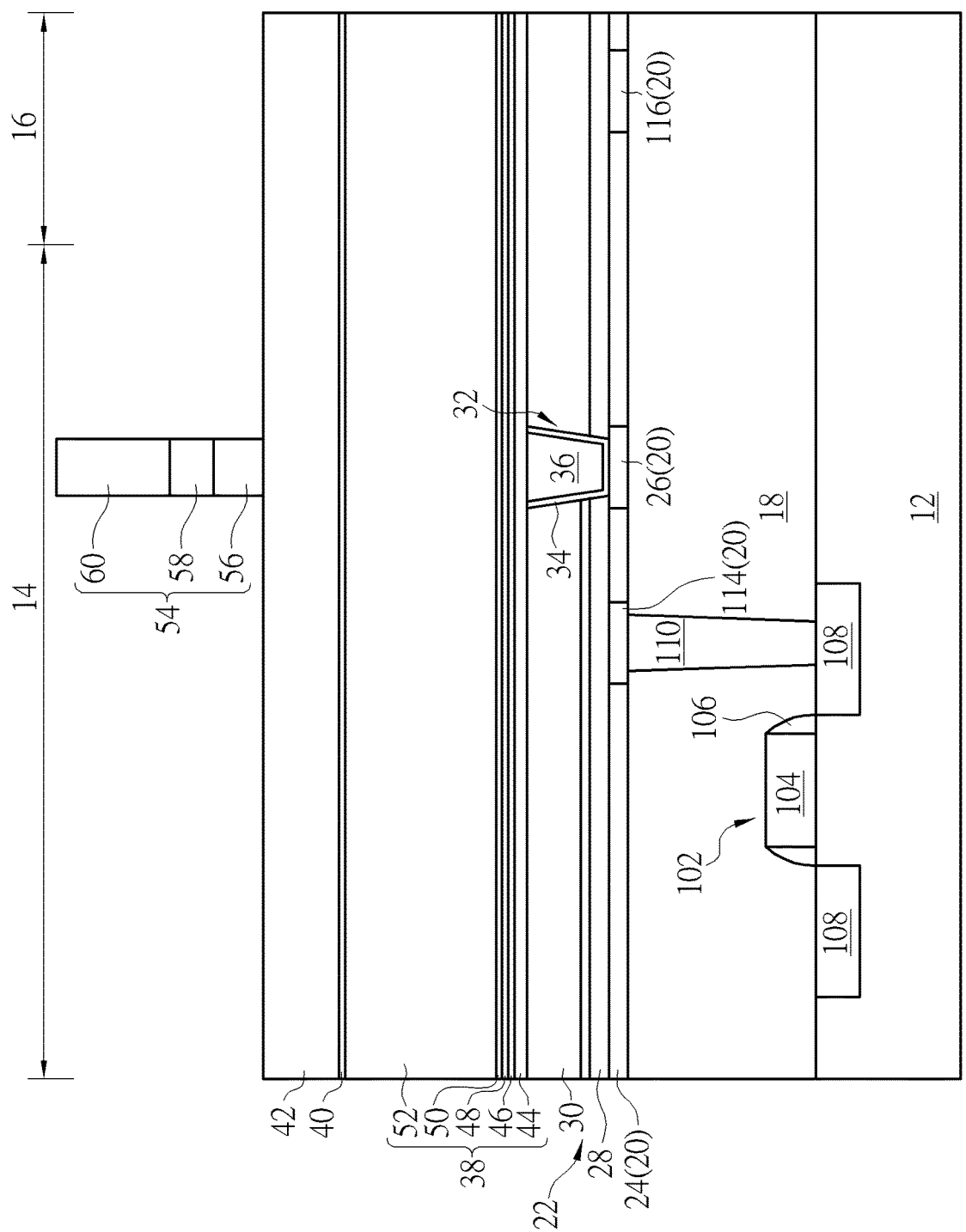
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as a metal-oxide semiconductor (MOS) transistor 102, passive devices, conductive layers, and interlayer dielectric (ILD) layer 18 could be formed on top of the substrate 12. More specifically, at least a planar MOS transistors or non-planar (such as FinFETs) MOS transistor could be formed on the substrate 12, in which the MOS transistor 102 could include transistor elements such as a gate structures (for example metal gate) 104, a spacer 106, a source/drain region 108, an epitaxial layer, and contact etch stop layer (CESL). The ILD layer 18 could be formed on the substrate 12 to cover the MOS transistor 102, and at least a contact plug 110 could be formed in the ILD layer 18 to electrically connect to the source/drain region 108 of MOS transistor 102. Since the fabrication of planar or non-planar transistor and ILD layer is well known to those skilled in the art, the details of which are not explained herein for the sake of brevity.

Next, metal interconnect structures 20, 22 are sequentially formed on the ILD layer 18 on the MTJ region 14 and the edge region 16, in which the metal interconnect structure 20 includes an inter-metal dielectric (IMD) layer 24 and metal interconnections 26, 114, 116 embedded in the IMD layer 24, the metal interconnect structure 22 includes a stop layer 28, an IMD layer 30, and metal interconnection 32 embedded in the stop layer 28 and the IMD layer 30, and the metal interconnection 114 is electrically connected to the aforementioned contact plug 110.

In this embodiment, each of the metal interconnections 26, 114, 116 from the metal interconnect structure 20 preferably includes a trench conductor and the metal interconnection 32 from the metal interconnect structure 22 on the MTJ region 14 includes a via conductor. Preferably, each of the metal interconnections 26, 32, 114, 116 from the metal interconnect structures 20, 22 could be embedded within the IMD layers 24, 30 and/or stop layer 28 according to a single damascene process or dual damascene process. For instance, each of the metal interconnections 26, 32, 114, 116 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layer 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide ($AlO_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
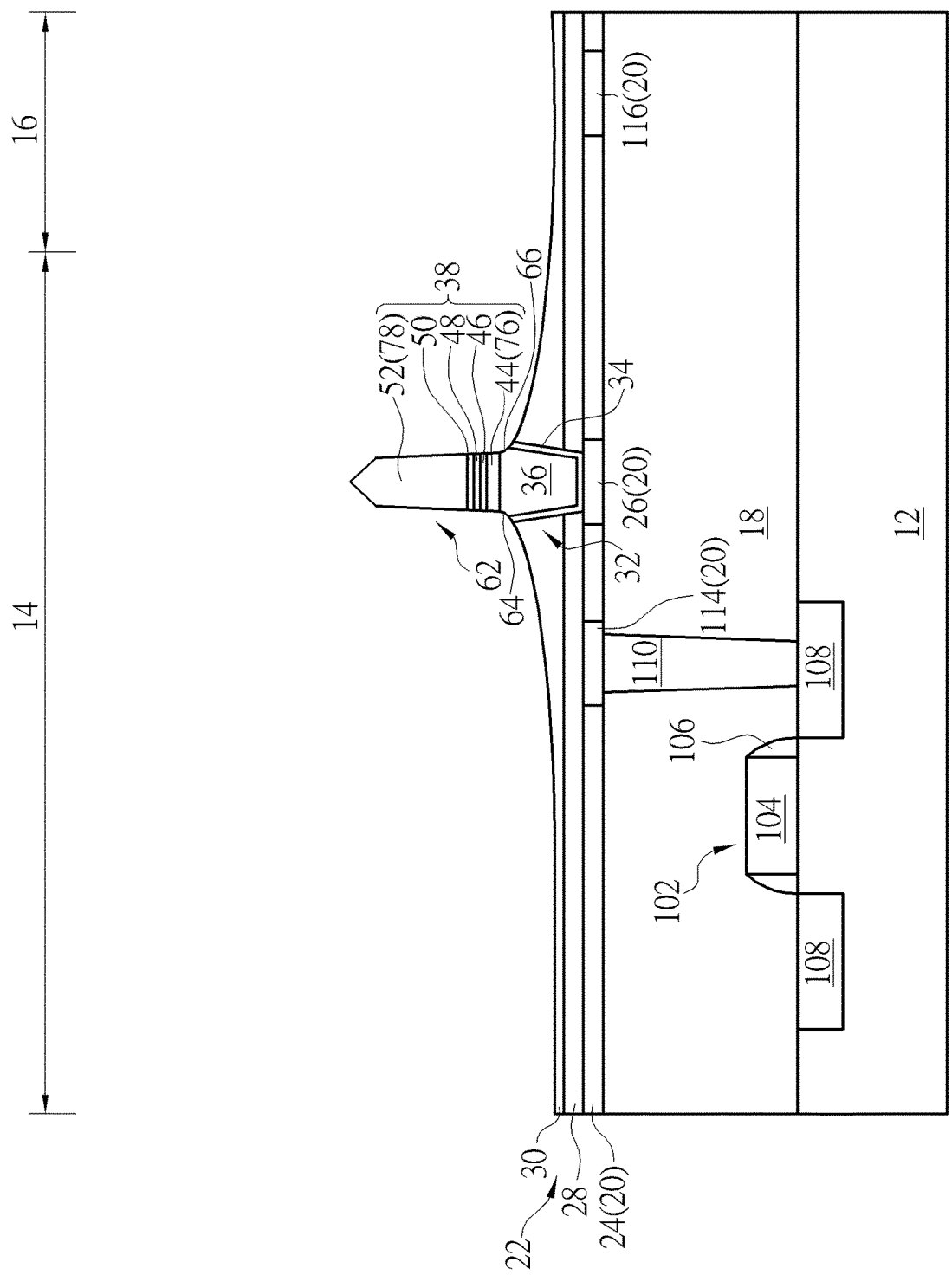

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14. Preferably, the patterned first electrode layer 44 becomes a bottom electrode layer 76 of the MTJ 62, the patterned second gate electrode layer 52 becomes a top electrode 78 of the MTJ 62, and the cap layers 40, 42 are removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, part of the top surface of the remaining IMD layer 30 is slightly lower than the top surface of the metal interconnection 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 64 and a second slanted sidewall 66 are formed on the metal interconnection 32 adjacent to the MTJ 62, in which each of the first slanted sidewall 64 and the second slanted sidewall 66 could further include a curve (or curved surface) or a planar surface. Moreover, more second electrode layer 52 closer to the tip of the MTJ 62 is preferably removed during the patterning of the MTJ stack 38 through the IBE process so that inclined sidewalls and top surfaces are formed on the patterned MTJ 62. Specifically, the tip or topmost surface the top electrode 78 of the MTJ 62 formed at the stage preferably includes a reverse V-shape while two sidewalls of the MTJ 62 are slanted sidewalls.

Figure 3:
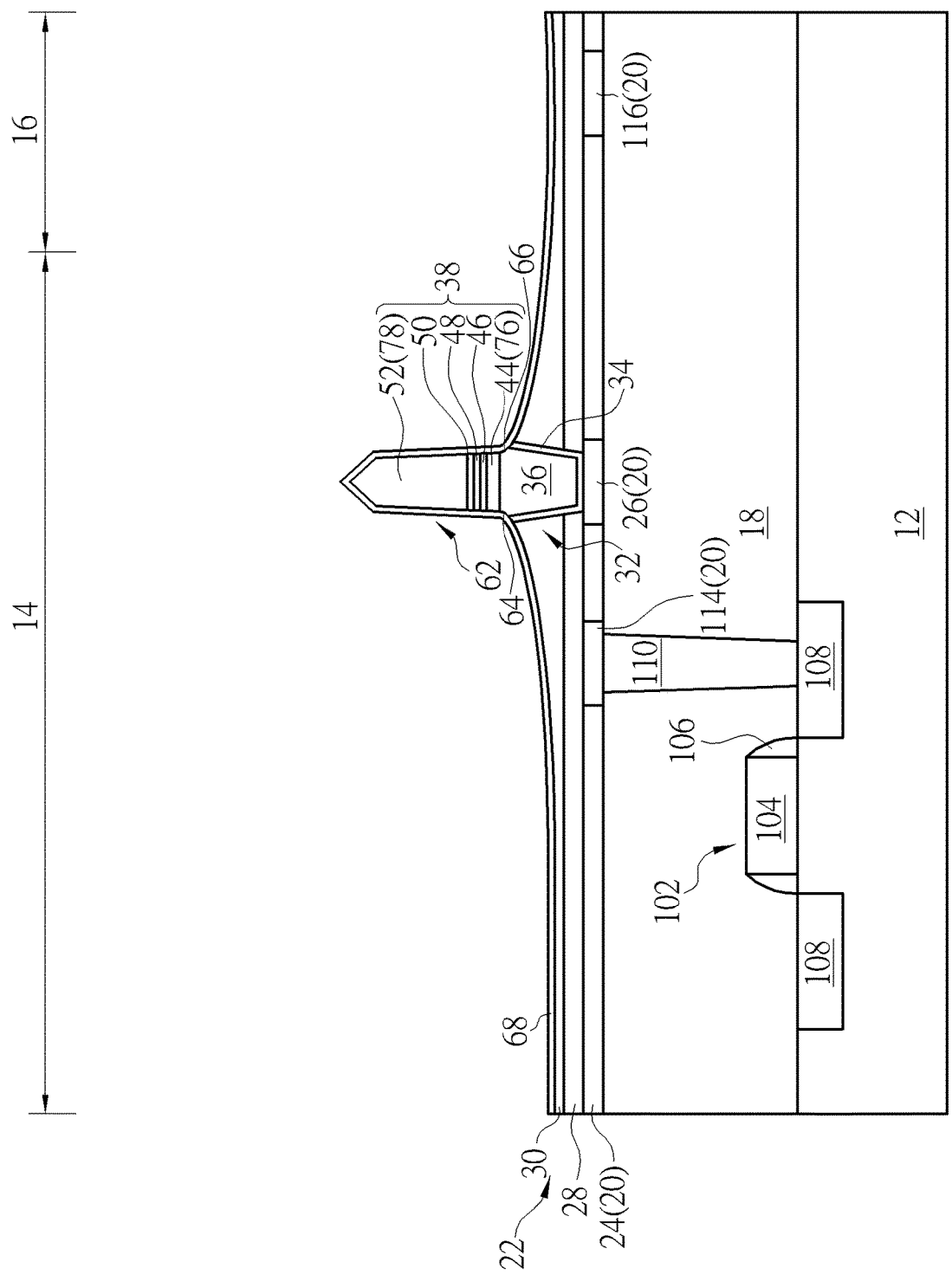

Next, as shown in FIG. 3, a liner 68 is formed on the MTJ 62 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
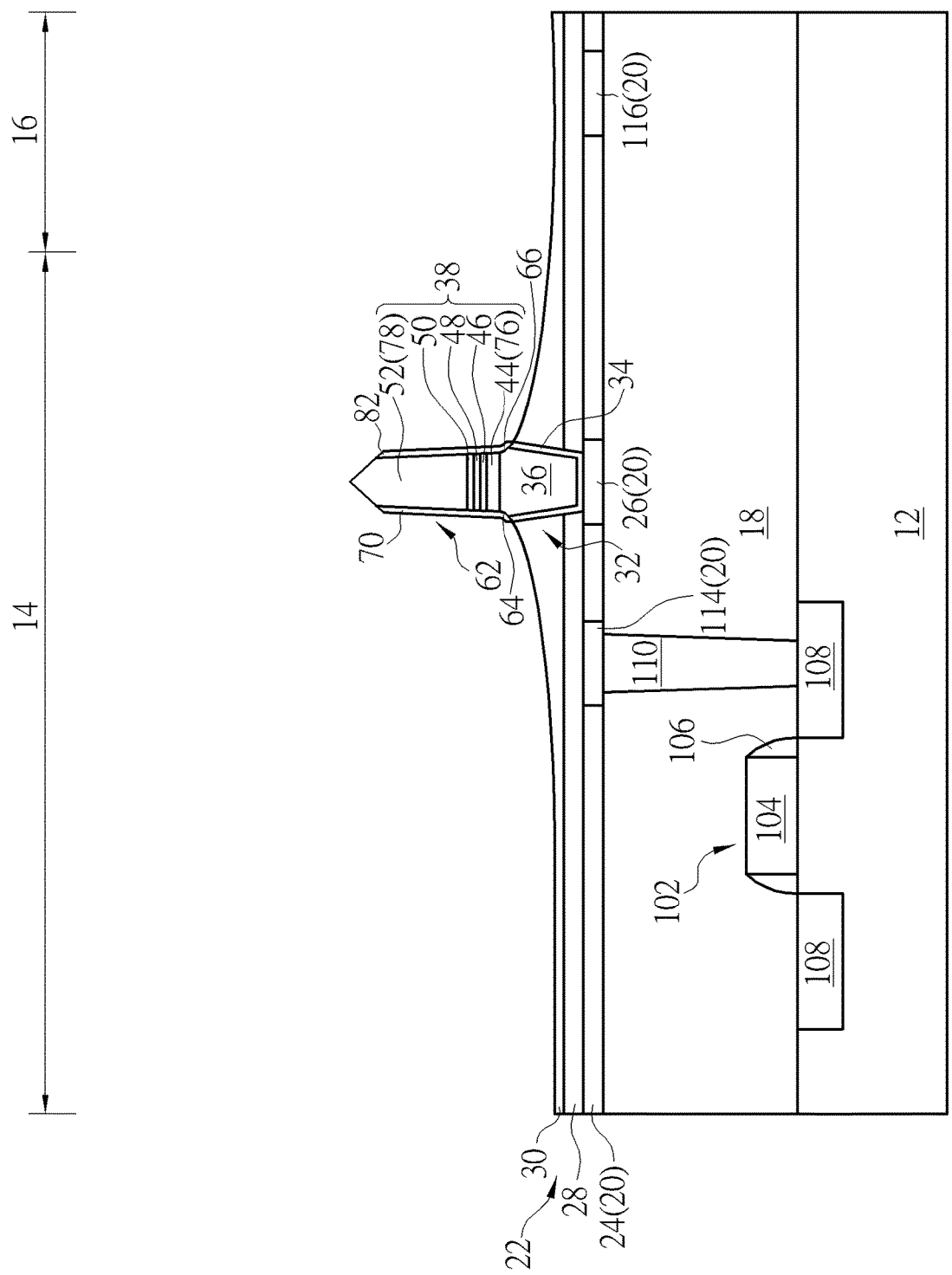

Next, as shown in FIG. 4, an etching process is conducted to remove part of the liner 68 to form a first spacer 70 and a second spacer 82 adjacent to the MTJ 62, in which the first spacer 70 and second spacer 82 are disposed on the sidewalls of the MTJ 62 and at the same time covering and contacting the first slanted sidewall 64 and second slanted sidewall 66 of the metal interconnection 32 directly.

Figure 5:
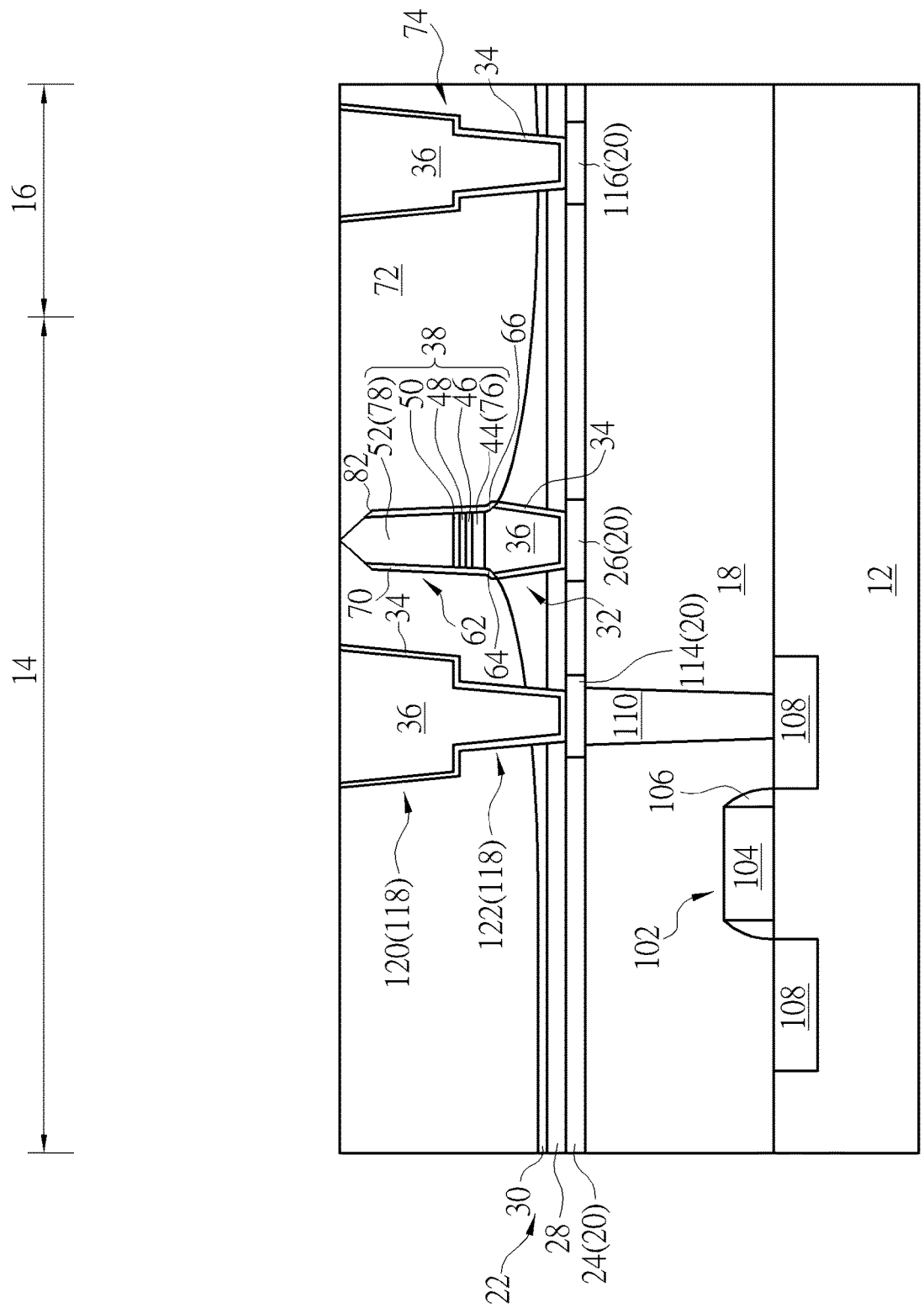

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with or slightly higher than the tip or top surface of the MTJ 62. Next, a pattern transfer process is conducted by using a patterned mask (not shown) to remove part of the IMD layers 30, 72 and stop layer 28 on the MTJ region 14 adjacent to the MTJ 62 and part of the IMD layers 30, 72 and stop layer 28 on the logic region 16 to form contact holes (not shown) exposing the metal interconnections 26, 114, 116 underneath. Next, metals are deposited into the contact holes and another planarizing process such as CMP is conducted to form metal interconnections 74, 118 or contact plugs in the contact holes, in which the metal interconnection 118 adjacent to the MTJ 62 is connected to the metal interconnection 114 underneath and the metal interconnection 74 on the logic region 16 is connected to the metal interconnection 116 underneath.

In this embodiment, each of the metal interconnections 74, 118 preferably includes a trench conductor 120 and a via conductor 122, in which the metal interconnections 74, 118 could be formed in the IMD layers 30, 72 and/or stop layer 28 according to a single damascene or dual damascene process. For instance, each of the metal interconnections 74, 118 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 36 are preferably made of copper and the IMD layer 72 is preferably made of silicon oxide.

Figure 6:
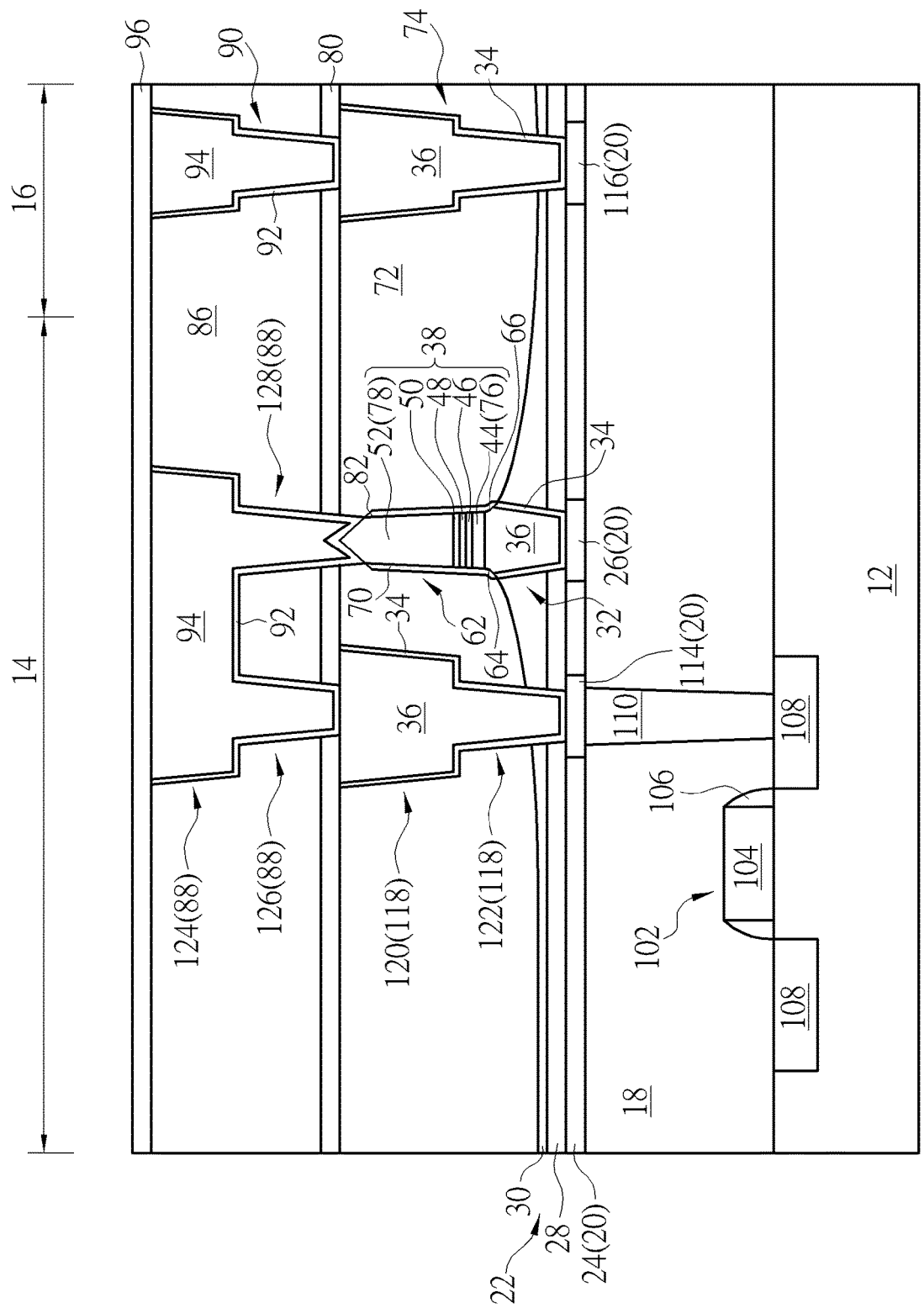

Next, as shown in FIG. 6, a stop layer 80 and another IMD layer 86 are formed on the MTJ 62 to cover the surface of the IMD layer 72, and one or more photo-etching process is conducted to remove part of the IMD layer 86 and part of the stop layer 80 on the MTJ region 14 and logic region 16 to form contact holes (not shown). Next, conductive materials are deposited into each of the contact holes and a planarizing process such as CMP is conducted to form metal interconnections 88, 90 directly connecting the metal interconnection 118, MTJ 62, and metal interconnection 74 underneath, in which the metal interconnection 88 on the MTJ region 14 preferably directly contacting the MTJ 62 and metal interconnection 118 underneath while the metal interconnection 90 on the logic region 16 directly contacts the metal interconnection 74 on the lower level. Next, another stop layer 96 is formed on the IMD layer 86 to cover the metal interconnections 88, 90.

In this embodiment, the stop layer 80 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 88, 90 could be formed in the IMD layer 86 through a single damascene or dual damascene process. For instance, the metal interconnection 88 on the MTJ region 14 preferably includes a trench conductor 124 and two via conductors 126, 128 disposed on the bottom of the trench conductor 124, in which the two trench conductors 126, 128 are connected to the trench conductor 120 and MTJ 62 respectively. As stated previously, each of the metal interconnections 88, 90 could further include a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 6, which further illustrates a structural view of a semiconductor device according to an embodiment of the present invention. As shown in FIG. 6, the semiconductor device preferably includes at least a MOS transistor 102 disposed on the substrate 12, an ILD layer 18 disposed on the MOS transistor 102, and a MTJ 62 disposed on the IMD layer 18, in which the top surface of the MTJ 62 is electrically connected to the source/drain region 108 of the MOS transistor 102.

Viewing from a more detailed perspective, the semiconductor device also includes a metal interconnection 32 connected to the bottom of the MTJ 62, an IMD layer 30 disposed on the IMD layer 18 and surrounding the metal interconnection 32, a metal interconnection 118 disposed adjacent to the MTJ 62, an IMD layer 72 disposed on the IMD layer 30 and surrounding the MTJ 62 and the metal interconnection 118, a metal interconnection 26 connected to the bottom of the metal interconnection 32, a metal interconnection 114 connected to the bottom of the metal interconnection 118 and the source/drain region 108 of the MOS transistor 102 while the source/drain region 108 not overlapping the MTJ 62, a metal interconnection 88 connected to the tip of the MTJ 62 and top of the metal interconnection 118, and an IMD layer 86 disposed on the IMD layer 72 to surround the metal interconnection 88.

Preferably, the metal interconnection 88 includes a trench conductor 124 and via conductors 126, 128 connected to the bottom of the trench conductor 124, in which the top surface of the trench conductor 124 is even with the top surface of the IMD layer 86, the via conductor 126 is connected to the trench conductor 120 adjacent to the MTJ 62, the via conductor 128 is connected to the MTJ 62, and top surfaces of the trench conductor 120 and IMD layer 72 are coplanar. It should be noted that the bottom surface of the trench conductor 126 includes a planar surface while the bottom surface of the trench conductor 128 includes a reverse V-shape directly connecting the reverse V-shape of the top surface of the MTJ 62. Overall, the MTJ in this embodiment is electrically connected to the metal interconnection 118 on the left side of the MTJ 62 through the metal interconnection 88 on the top and then further connected to the source/drain region 108 of the MOT transistor 102 thereby constituting a reverse cell.

Figure 7:
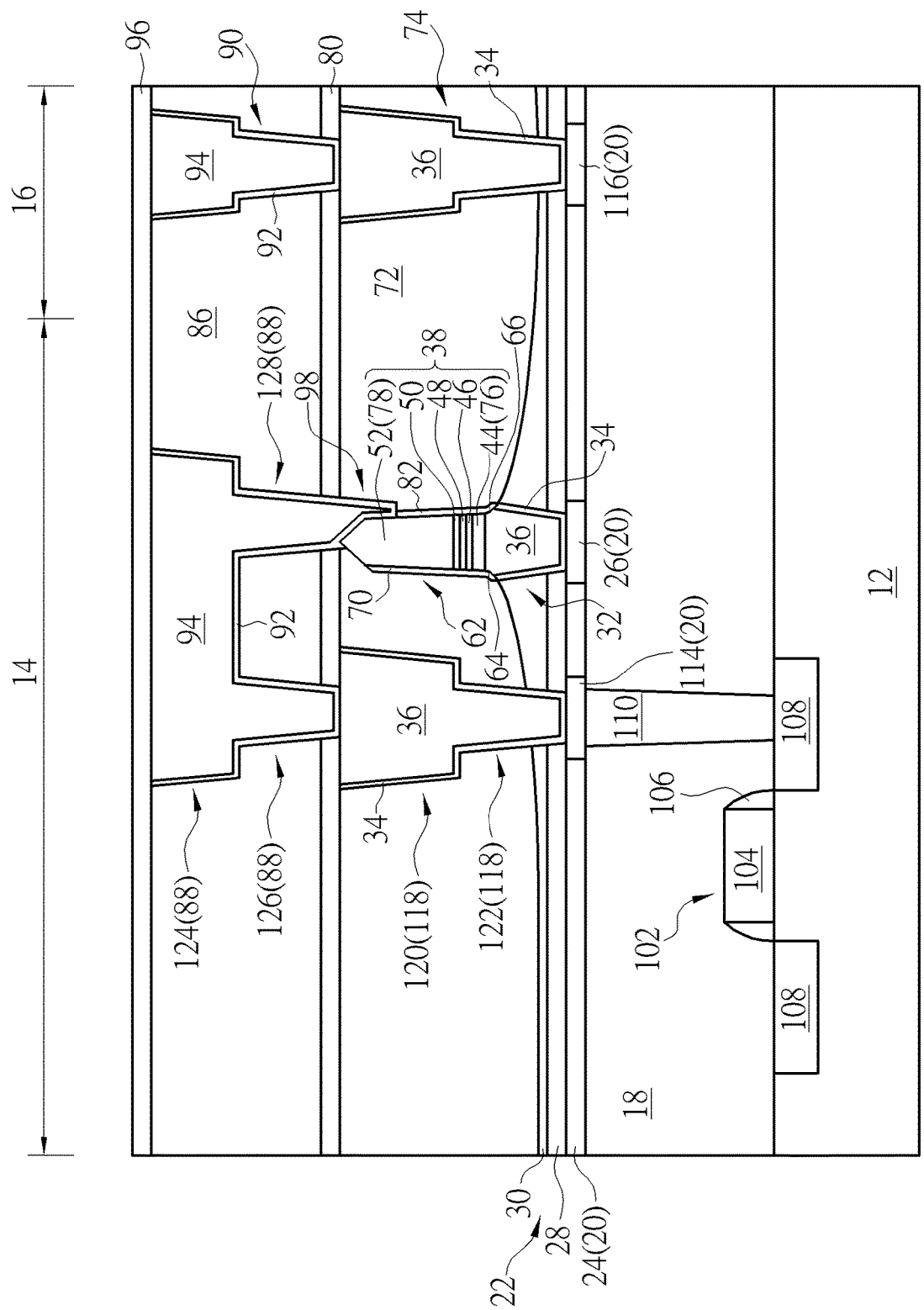
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, it would be desirable to adjust the position of the mask during the photo-etching process for forming the metal interconnection 88 in FIG. 6 so that the not only the stop layer 80 and IMD layer 86 directly on top of the MTJ 62 is removed part of the IMD layer 72 and even part of the second spacer 82 could also be removed at the same time. By using this approach, a dislocation of shift in position between the metal interconnection (or more specifically the via conductor 128) and the MTJ 62 underneath could be obtained. In other words, the bottom portion of the metal interconnection 88 not only contacts the tip of the MTJ 62 directly but also contacts the sidewall of the MTJ 62 at the same time.

Structurally, the semiconductor device shown in FIG. 7 preferably includes a MTJ 62 disposed on the substrate on the MTJ region 14, a metal interconnection 74 disposed on the logic region 16 adjacent to the MTJ 62, an IMD layer 72 surrounding the MTJ 62 and metal interconnection 74, a metal interconnection 32 connected to the bottom of the MTJ 62, a metal interconnection 88 connected to and directly contacting the tip and part of the sidewall of the MTJ 62, another metal interconnection 90 connected to and directly contacting the metal interconnection 74, an IMD layer 86 surrounding the metal interconnections 88, 90, a stop layer disposed between the IMD layers 72, 86, and another stop layer 96 covering the metal interconnections 88, 90 and the IMD layer 86.

In this embodiment, the MTJ 62 preferably includes a bottom electrode 76, a fixed layer 46, a free layer 48, a capping layer 50, and a top electrode 78, a first spacer 70 is disposed on one sidewall of the MTJ 62, and a second spacer 82 is on another sidewall of the MTJ 62, in which the first spacer 70 and second spacer 82 are asymmetrical structures. Viewing form a more detailed perspective, the bottom of the first spacer 70 preferably contacts the first slanted sidewall 64 directly, the bottom of the second spacer 82 contacts the second slanted sidewall 66 directly, the top surface of the first spacer 70 is even with the reverse V-shape surface of the top electrode 78 of MTJ 62, and the top surface of the second spacer 82 is preferably lower than the lowest point of the reverse V-shape of the top electrode 78 but higher than the top surface of the capping layer 50 or free layer 48. In other words, the first spacer 70 and second spacer 82 preferably include different heights.

Viewing form a more detailed perspective, the metal interconnection 88 or more specifically the via conductor 128 directly above the MTJ 62 preferably includes a protrusion 98 extended from the bottom of the via conductor 128 downward to contact an inclined sidewall of the top electrode 78. Since the second spacer 82 does not cover the sidewall of the MTJ 62 entirely thereby exposing part of the sidewall of the MTJ 62, the protrusion 98 preferably contacts the top electrode 78, the second spacer 82, and the IMD layer 72 directly while the bottommost surface of the protrusion 98 is higher than the top surface of the capping layer 50 or free layer 48. It should be noted that the tip or topmost surface of the MTJ 62 includes a reverse V-shape while two sidewalls of the MTJ 62 include slanted sidewalls, the bottom surface of the via conductor 128 directly above the MTJ 62 contacts one surface of the reverse V-shape of the MTJ 62 tip, and the protrusion 98 contacts one inclined sidewall of the MTJ 62, in which the via conductor 128 could contact only one slanted sidewall of the reverse V-shape or both slanted sidewalls of the reverse V-shape at the same time depending on the demand of the product.

Figure 8:
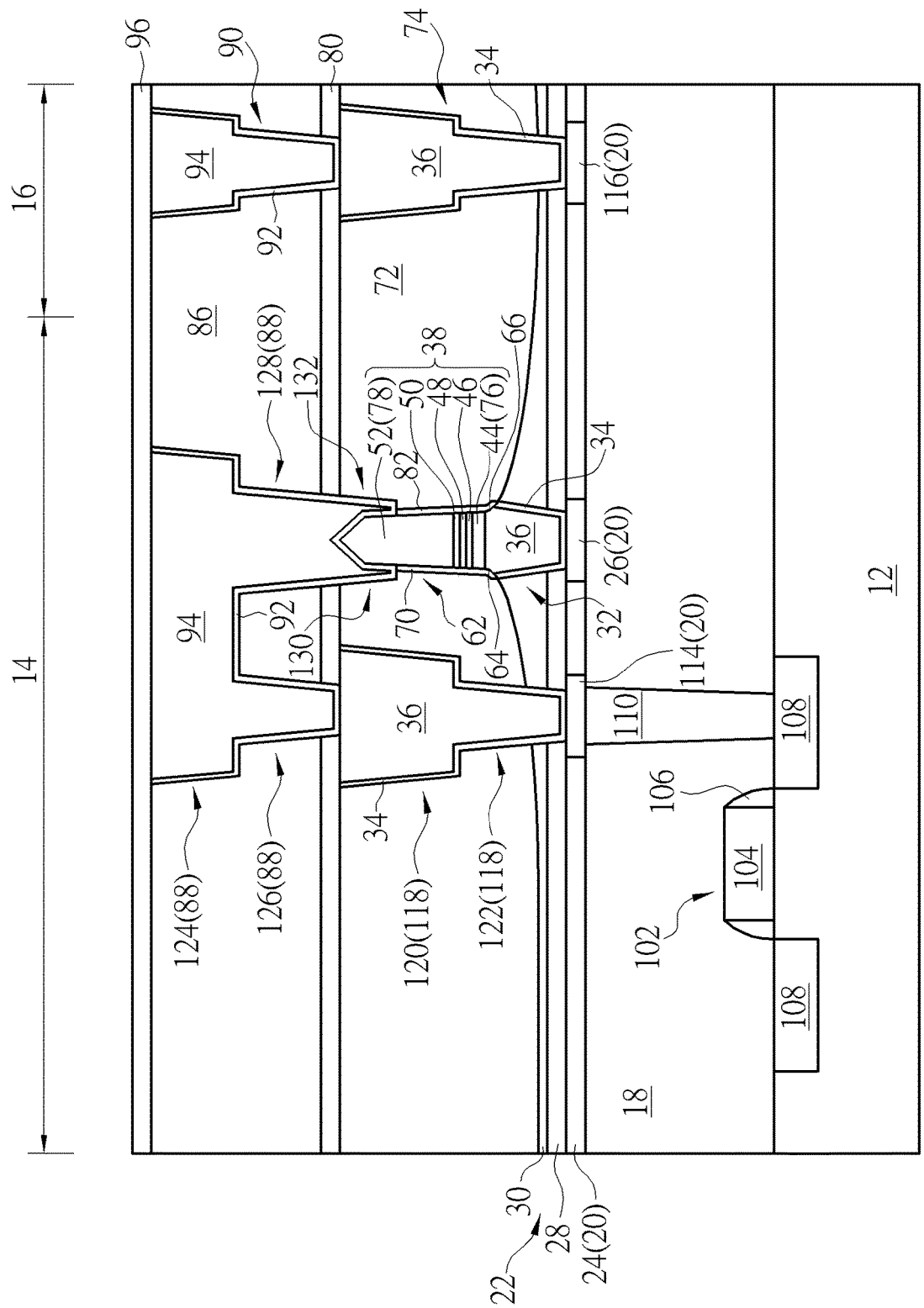
FIG. 8 illustrates a structural view of a semiconductor device according to an embodiment of the present invention.

It should further be noted that even though the metal interconnection 88 in this embodiment is shifting toward the right side of the MTJ 62 while the protrusion 98 contacts the right sidewall of the MTJ 62, according to other embodiments of the present invention, it would also be desirable to form metal interconnection 88 shifting toward the left side of the MTJ 62 while the protrusion 98 contacts the left sidewall of the MTJ 62. Moreover, according to yet another embodiment of the present invention, as shown in FIG. 8, it would also be desirable to form two protrusions including a first protrusion 130 and a second protrusion 132 extending from the bottom of the via conductor 128 downward to contact two sidewalls of the MTJ 62 respectively. For instance, the first protrusion 130 preferably contacts the left sidewall of the top electrode 78 while the right protrusion 132 contacts the right sidewall of the top electrode 78, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal-oxide semiconductor (MOS) transistor on a substrate;
   an interlayer dielectric (ILD) layer on the MOS transistor; and
   a magnetic tunneling junction (MTJ) on the ILD layer, wherein a top surface of the MTJ is electrically connected to a source/drain region of the MOS transistor and a top surface of a top electrode of the MTJ comprises a reverse V-shape.

2. The semiconductor device of claim 1, further comprising:
   a first metal interconnection connected to a bottom surface of the MTJ;
   a first inter-metal dielectric (IMD) layer on the ILD layer and around the first metal interconnection;
   a second metal interconnection adjacent to the MTJ;
   a second IMD layer on the first IMD layer and around the MTJ and the second metal interconnection;
   a third metal interconnection connected to a bottom surface of the first metal interconnection;
   a fourth metal interconnection connected to a bottom surface of the second metal interconnection and the source/drain region of the MOS transistor;
   a fifth metal interconnection connected to the top surface of the MTJ and the second metal interconnection; and
   a third IMD layer on the second IMD layer and around the fifth metal interconnection.

3. The semiconductor device of claim 2, wherein the second metal interconnection comprises:
   a first trench conductor; and
   a first via conductor connected to a bottom surface of the first trench conductor.

4. The semiconductor device of claim 3, wherein top surfaces of the first trench conductor and the second IMD layer are coplanar.

5. The semiconductor device of claim 3, wherein the fifth metal interconnection comprises:
   a second trench conductor; and
   a second via conductor and a third via conductor under the second trench conductor, wherein the second via conductor is connected to the first trench conductor and the third via conductor is connected to the MTJ.

6. The semiconductor device of claim 5, wherein top surfaces of the second trench conductor and the third IMD layer are coplanar.

7. The semiconductor device of claim 5, wherein a bottom surface of the second via conductor comprises a planar surface.

8. The semiconductor device of claim 5, wherein a bottom surface of the third via comprises a reverse V-shape.

9. The semiconductor device of claim 1, wherein a top surface of the MTJ comprises a reverse V-shape.

\* \* \* \* \*